United States Patent [19]
Bruno et al.

[11] Patent Number: 5,138,193
[45] Date of Patent: Aug. 11, 1992

[54] ELECTRIC PULSE GENERATOR OF THE SATURABLE INDUCTOR TYPE

[75] Inventors: Charles Bruno, Issur-Tille; Michel Roche, Dijon, both of France

[73] Assignee: Commissariat A L'Energie Atomique, Paris, France

[21] Appl. No.: 571,554

[22] Filed: Aug. 29, 1990

[30] Foreign Application Priority Data

Mar. 7, 1988 [FR] France ............................... 88 02865

[51] Int. Cl.⁵ .............................................. H03K 3/45
[52] U.S. Cl. ..................... 307/419; 307/106; 307/108
[58] Field of Search .............. 307/104, 106, 108, 401, 307/419, 422, 314, 200.1; 328/65; 333/20

[56] References Cited

U.S. PATENT DOCUMENTS

| | | | |
|---|---|---|---|
| 3,629,605 | 6/1969 | Nilsson | 307/106 |
| 4,189,650 | 2/1980 | Aaland | 307/108 |
| 4,757,295 | 7/1988 | Pike | 336/84 C |
| 4,849,649 | 7/1989 | Roche et al. | 307/108 |

FOREIGN PATENT DOCUMENTS

2140236 11/1984 United Kingdom .

OTHER PUBLICATIONS

Instruments and Experimental Techniques, vol. 19, No. 3, part 2, May/Jun. 1976, pp. 769-772 (Dubnev et al.).
Instruments and Experimental Techniques, vol. 30, No. 2, part 1, Mar./Apr. 1987, pp. 343-345. (Zheltov et al.).
Applied Physics Letters, vol. 41, No. 5, Sep. 1987, pp. 392-394. (Chang et al.).

Primary Examiner—Howard L. Williams
Assistant Examiner—Richard T. Elms
Attorney, Agent, or Firm—Michael N. Meller

[57] ABSTRACT

An electric pulse generator for the formation of high power electric pulses. The generator includes a capacitor having coaxial electrodes and a coaxial electrode shaping line. Magnetic compression means include the capacitor for charging the shaping line and a magnetic switch with a saturable inductor for discharging the shaping line. This arrangement reduces parasitic inductances and provides a generator having a compact, simple structure which is less expensive than known generators.

14 Claims, 4 Drawing Sheets

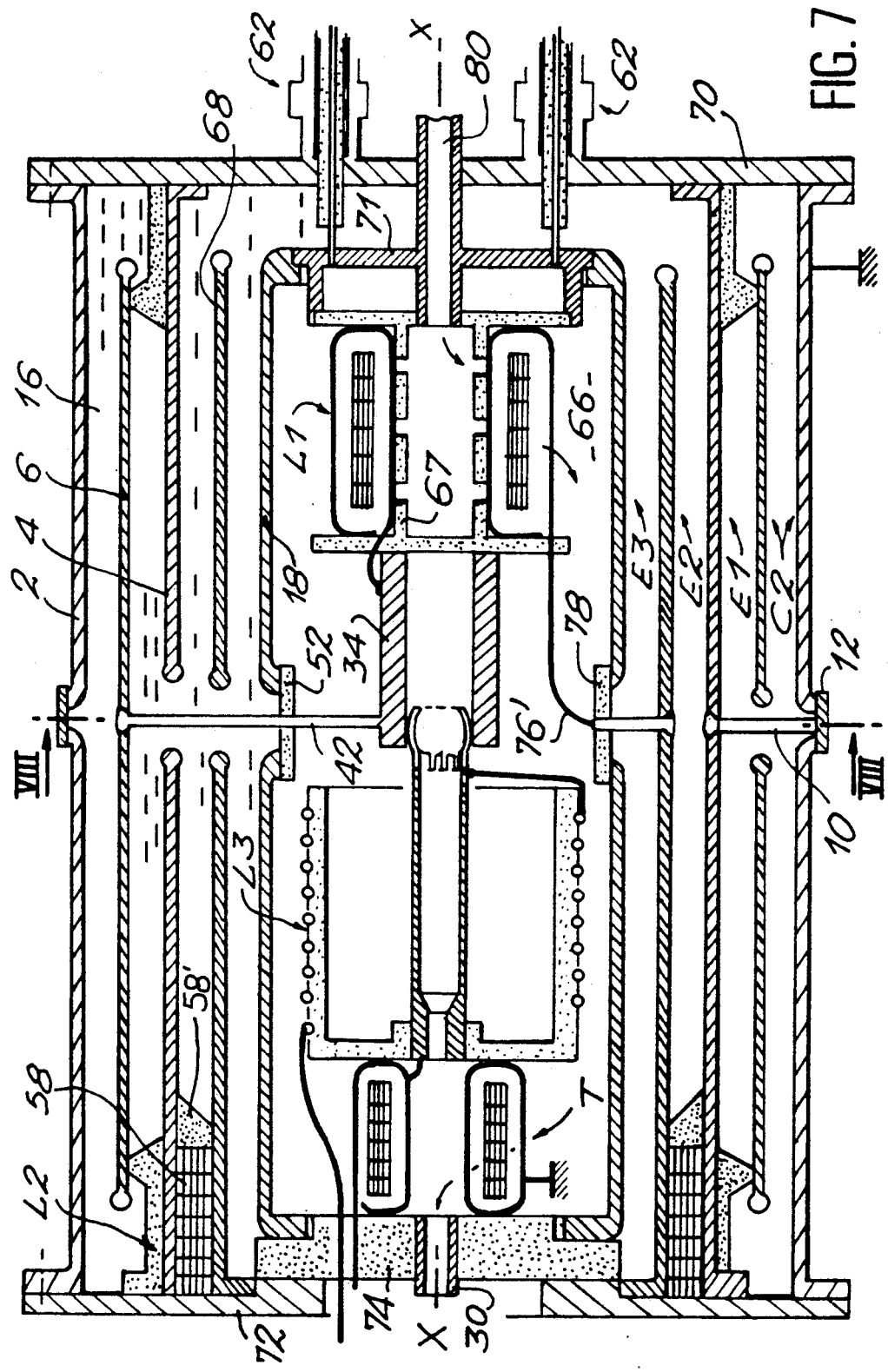

ELECTRIC PULSE GENERATOR OF THE SATURABLE INDUCTOR TYPE

The present invention relates to an electric pulse generator of the saturable inductor or reactor type. It applies more particularly to the formation of high power electric pulses.

This generator utilises the magnetic compression principle referred to for the first time by MELVILLE in 1951. (see U.S. Pat. No. 2,869,004)

BACKGROUND OF THE INVENTION

Numerous circuits are already known which utilise said principle, both in the field of radar modulators and in the field of pulse generators for supplying induction accelerators. The latter generators have in particular been developed in the USA by the Lawrence National Livermore Laboratory.

FIG. 1 diagrammatically shows a known saturable inductor pulse generator. Said generator comprises a capacitor C1, which is charged to relatively low voltage, e.g. 30 kV, and which initially contains the energy necessary for producing a pulse at the terminals of a charge or load R. Use is e.g. made of a 2.2 microfarad capacitor C1 if it is wished to obtain, at the generator output, an energy of approximately 1 kJ in the load R. A switch I, e.g. constituted by a spark gap switch, a thyristor chain or a gas thyratron, makes it possible to discharge the capacitor C1 in to a capacitor C2, via a transformer T, whose transformation ratio n generally close to 10. In order that the transfer efficiency from C1 to C2 is at a maximum, it is necessary that the capacitance of C2 is equal to that of C1, divided by $n^2$. If n is equal to 10 and if C has a capacitance of 2.2 microfarads, a capacitor C2 with a capacitance of 22 nF will be chosen.

Said capacitor C2 is fitted between the terminals of the secondary of the transformer T. One of its terminals, designated A1 in FIG. 1, is connected to earth or ground. The other terminal of T is designated A. The voltage $V_A$ at the terminals of the capacitor C2 varies as a function of time t in accordance with the curve shown in FIG. 2, where it can be seen that in the aforementioned numerical example, a voltage of 300 kV is reached at the end of approximately 1 microsecond. A high voltage such as this in practise makes it possible to use a capacitor C2 having a high permittivity dielectric, e.g. an electrically insulating liquid such as water, whose permittivity of approximately 80 makes it possible to obtain the high capacitance required for the capacitor C2.

The generator shown in FIG. 1 also comprises a coaxial shaping line Zo, a saturable inductor L1, another saturable inductor L2 and as well as an inductor L3, whose function will be explained hereinafter. One end of the central conductor of the line Zo is connected to the terminal A via saturable inductor L1 and the other end of said central conductor is connected to a terminal of the load R via saturable inductor L2. The other terminal of the load R is connected to one end of the outer conductor of the line Zo, whilst the other end of said outer conductor is connected to the grounded terminal A1.

Throughout the charging of the capacitor C2, the discharging current transversing the saturable inductor L1 remains sufficiently low to be ignored. This inductor L1 can be constructed in such a way that it becomes saturated as soon as the maximum voltage is reached at the terminals of C2. The inductor L1 then becomes very low and the current transversing it increases considerably in such a way that the capacitor C2 discharges into the shaping line Zo. If the capacitance of the latter is identical to that of C2, the energy transfer takes place from one to the other at a constant voltage with an efficiency close to 1. In the same way as in the preceding stage, throughout the charging time of the line Zo, a discharging current appears, which passes through the saturable inductor L2 and remains low for as long as the maximum charging voltage of Zo is not reached. Inductor L2 is constructed in such a way that it is saturated at the time when said maximum voltage is reached, the line Zo discharging into the load R, which is equal to the characteristic impedance of the line Zo. Under these conditions, a square-wave pulse appears at the terminals of the load R and its duration is equal to the outward and return time of the electric pulse in the line Zo and whose amplitude is equal to half the charging voltage of said line Zo, i.e. an amplitude of e.g. 130 kV.

The inductor L3, whereof one terminal is connected to the terminal A, is used for demagnetizing the respective cores of the transformer T and the saturable inductor L1 following an electric pulse. The other terminal of L3 is supplied by a d.c. voltage of appropriate polarity, in order to ensure the demagnetization of said cores.

FIG. 3 diagrammatically shows another electric pulse generator of the saturable inductor type and which is known in the art. Said other generator differs from that shown in FIG. 1 by the fact that the single coaxial line Zo is replaced by a double coaxial line Z1, i.e. a so-called BLUMLEIN coaxial line. Said double coaxial line Z1 comprises three electrodes, namely a central electrode E2 between an external electrode E1 and an internal electrode E3. In the generator shown in FIG. 3, one end of the electrode E2 is connected to the terminal A1 across the saturable inductor L2 and the other end of said electrode E2 is connected to the terminal A across the saturable inductor L1. One terminal B of the load R is connected to one end of the internal electrode E3, whose other end is free, whilst the other terminal of the load R is connected to one end of the external electrode E1, whose other end is connected to the terminal A1.

In the generator shown in FIG. 3, switching takes place by the saturable inductor L2 which, at the time of its saturation, short-circuits the electrodes E1 and E2, so that at the terminals of the load R appears a pulse, whose corresponding voltage $V_B$ is represented as a function of the time t in FIG. 4. It is a substantially square-wave negative pulse i1, whose amplitude is equal, in absolute values, to the maximum of the charging voltage $V_A$, which represents the interest of the generator shown in FIG. 3.

During the charging of the line Z1, approximately half the charging current passes through the load R, which produces a "prepulse" i2, which can also be seen in FIG. 4.

The saturable inductor-type electric pulse generators known in the art suffer from the disadvantages of large overall dimensions and high cost, which considerably decreases the interest therein.

SUMMARY OF THE INVENTION

The object of the present invention is to obviate this disadvantage by proposing a generator having a compact, simple structure, which is less expensive than the known generators.

In a preferred embodiment, the generator according to the invention only has two enclosures, one filled with a liquid such as water and the other filled with a liquid such as oil or liquid freon. Thus, the number of oil-water interfaces is considerably reduced, which is advantageous because such interfaces often cause problems.

More specifically, the present invention relates to an electric pulse generator, characterized in that it comprises a line with coaxial electrodes for shaping pulses, magnetic compression means for charging said shaping line and a saturable inductor magnetic switch for discharging said line, in that the magnetic compression means incorporate a capacitor having at least two facing, coaxial electrodes, in that said electrodes and said shaping lines are coaxial and that the electrodes of the capacitor surround said shaping line.

The shaping line can be a double line.

According to a preferred embodiment of the generator according to the invention, it comprises additionally a transformer for charging the coaxial electrode capacitor, at least one demagnetization inductor and another saturable inductor associated with the coaxial electrode capacitor in the magnetic compression means and which connects said capacitor to the shaping line, and the transformer, the demagnetization inductor and said other saturable inductors are surrounded by the shaping line.

In this way, there is a further increase in the compactness of the generator according to the invention and the structure is simplified.

Preferably, the connection between the coaxial electrode capacitor and the other inductor associated therewith and the connection between said other inductor and the shaping line are in each case provided by at least two electrical conductors extending perpendicularly to the axis of the electrodes in the median plane of the shaping line, said plane being perpendicular to the axis.

In this way, there is a reduction in the parasitic inductances resulting from said connections, which makes it possible to reduce the propagation time of the electric signal between the coaxial electrode capacitor and the other inductor associated therewith on the one hand and between said other inductor and the shaping line on the other.

Preferably, one of the electrodes of said capacitor and one of the electrodes of the shaping line are grounded and said grounded electrodes are connected by at least two electrical conductors extending perpendicular to the axis of the electrodes, into the median plane of the shaping line, said plane being perpendicular to the axis. This also make it possible to reduce the propagation time of the electric signal between said grounded electrodes.

In a preferred embodiment of the invention, the shaping line is charged in its centre, defined along the axis of the electrodes. This makes it possible to reduce the charging time of said shaping line.

Preferably, the internal volume of the shaping line is immersed in a liquid such as oil or liquid freon and the dielectric of said capacitor is an electrically insulated liquid, e.g. water, tight, electrically insulating means being provided to prevent any contact between these liquids.

BRIEF DESCRIPTION OF THE DRAWING

The invention is described in greater detail hereinafter relative to non-limitative embodiments and the attached drawings, wherein show:

FIG. 7 a diagrammatic longitudinal sectional view of an embodiment of the generator according to the invention.

DESCRIPTION OF THE PREFERRED EMBODIMENTS

Figure 5:
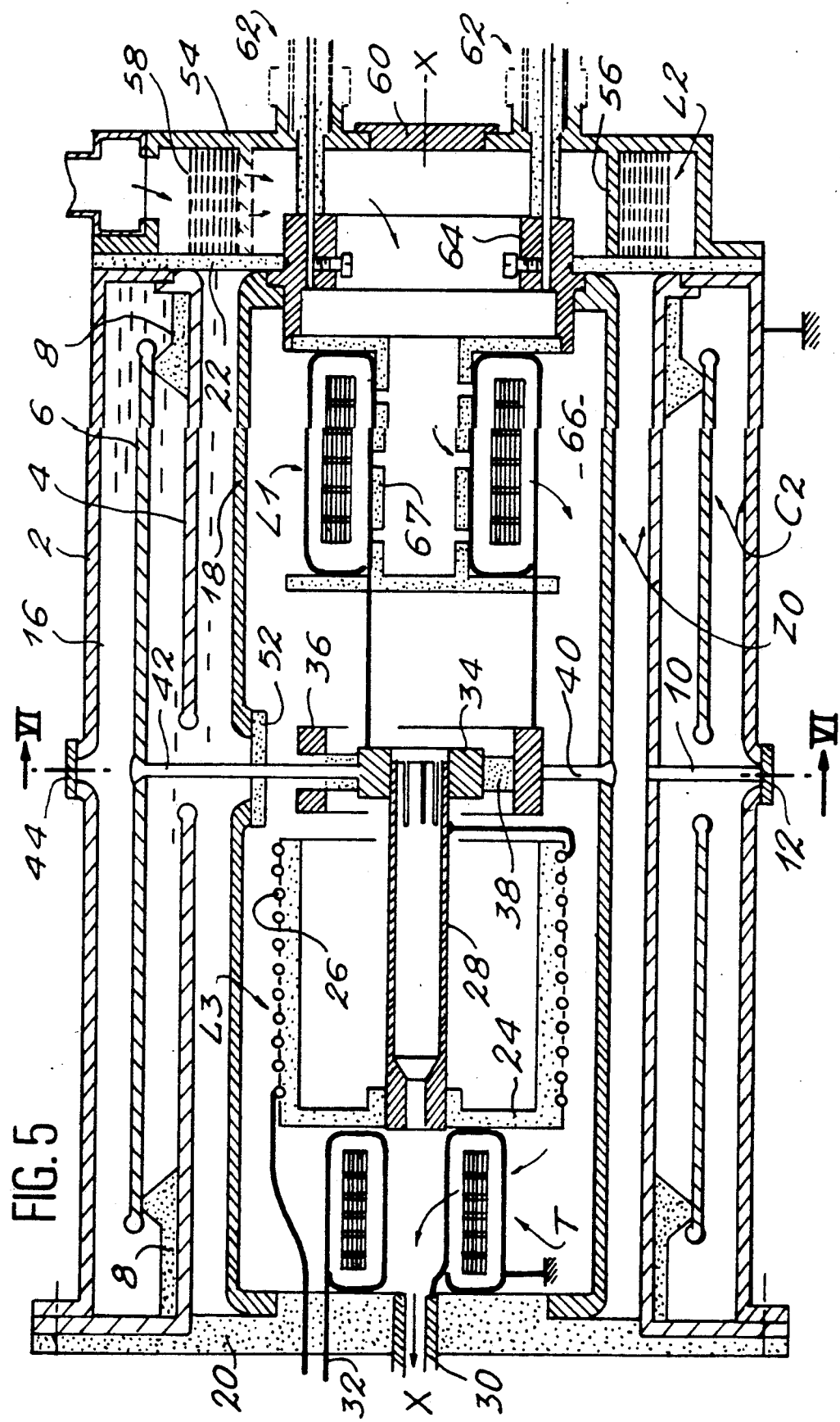
FIG. 5 a diagrammatic longitudinal sectional view of a first embodiment of the generator according to the invention.

The generator diagrammatically shown in FIG. 5 has a symmetry of revolution about an axis X. FIG. 5 contains said axis X and has an upper part (located above X), which is a sectional view along a vertical plane containing X and assumed to be horizontal, as well as a lower part (located below X), which is a sectional view along a horizontal plane containing X.

Figure 2:
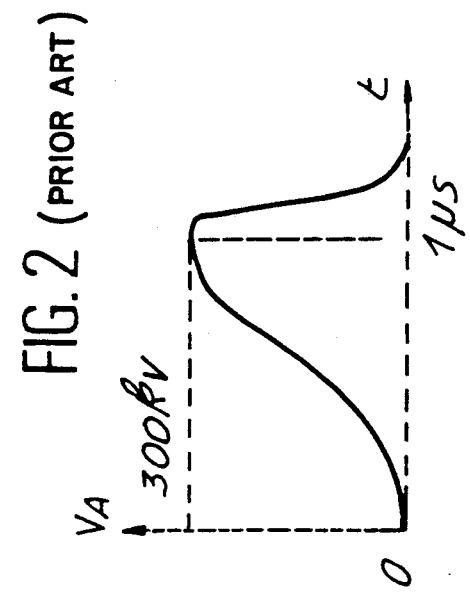
FIG. 2 a graph showing the time evolution of a voltage between the terminals of a capacitor forming part of the generator shown in FIG. 1 and which is already been described.
Figure 4:
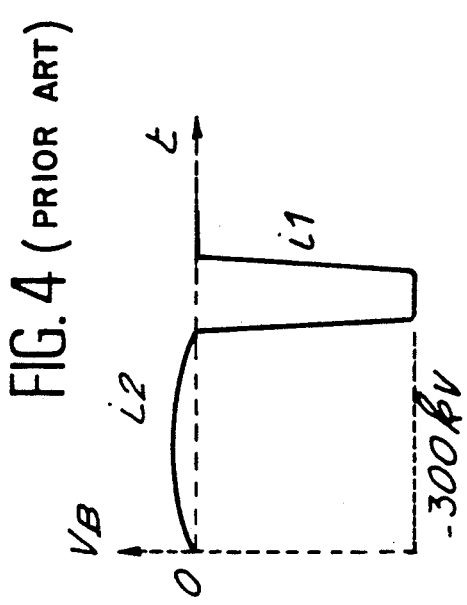
FIG. 4 a graph showing the time evolution of a voltage between the terminals of a load associated with the generator shown in FIG. 3 and which has already been described.
Figure 1:
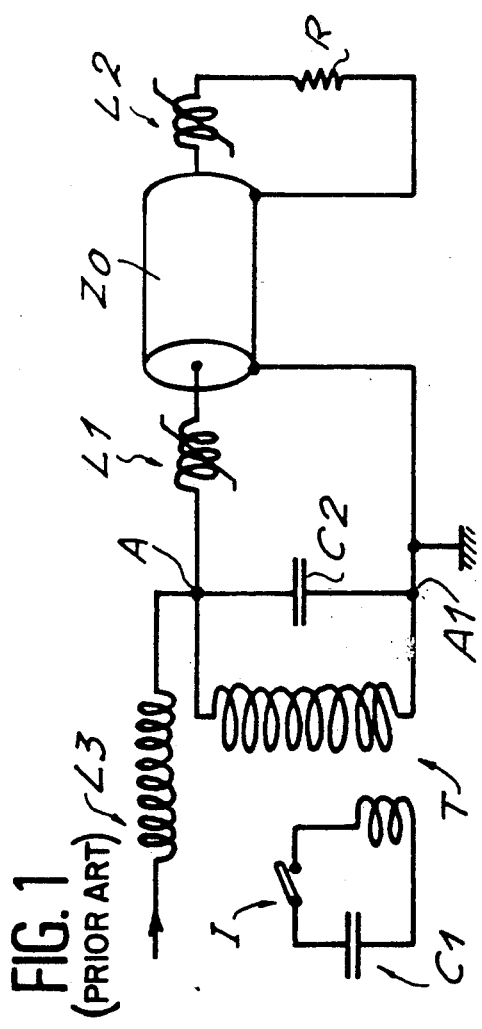
FIG. 1 a diagrammatic view of a known electric pulse generator which has already been described.

The electric diagram of the generator shown in FIG. 5 is like that of FIG. 1, except that in the generator of FIG. 5, the line Zo is charged in its median part and not at one end thereof.

A description will now be given of the structure of the generator shown in FIG. 5. Said generator comprises two cylindrical, electrically conductive walls 2 and 4 having as their axis the axis X and which are positioned facing one another, the outer wall carrying the reference 2. The two ends of the wall 2 are tightly connected respectively to the two corresponding ends of the wall 4, so as to obtain a tight volume between said two walls 2 and 4, as well as an electrical connection between them, at each of said two ends.

Between the walls 2 and 4 is placed a cylindrical electrode 6 of axis X, which has no contact with the walls 2 and 4 and whose ends are spaced from the corresponding ends of the walls 2 and 4 and bear on the wall 4 via electrically insulating shims 8, e.g. made from a plastics material such as polyethylene or polyvinyl chloride.

Figure 6:
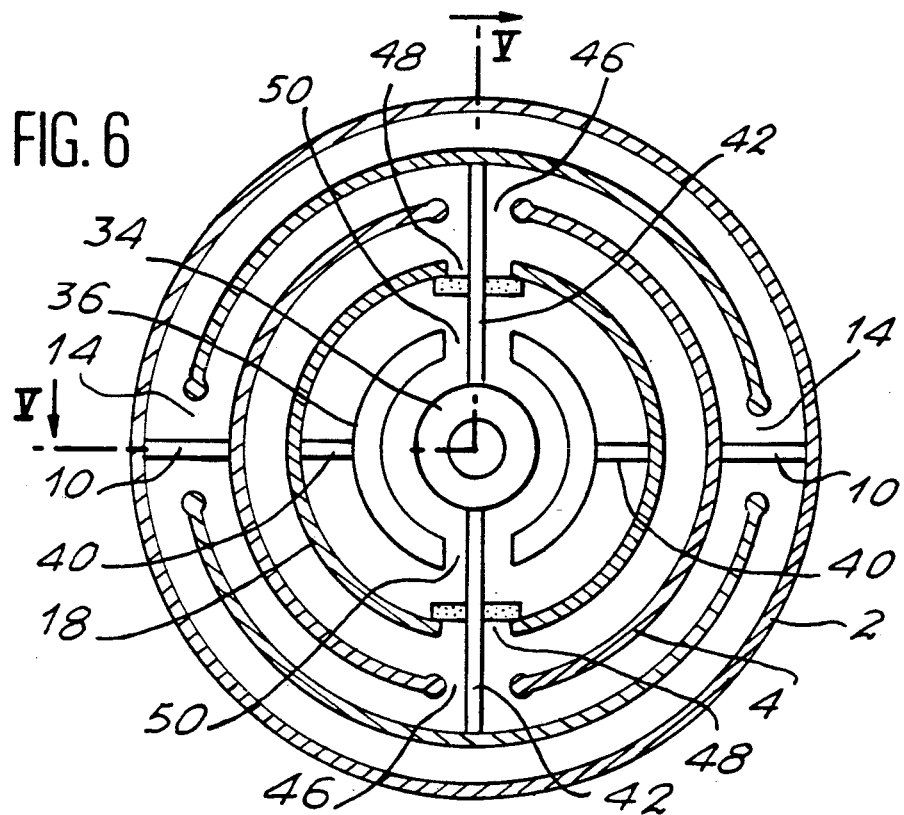
FIG. 6 a cross-sectional view of the generator shown in FIG. 5.

There is an additional electrical connection between the walls 2 and 4 in the median plane of the assembly constituted by said two walls 2,4. This plane is perpendicular to the axis X and is hereinafter called the "median plane of the generator". As can be seen in FIG. 6, which is a sectional view of the generator of FIG. 5 along said median plane, said supplementary connection is constituted by two conductive rods 10, which are aligned and symmetrical to one another with respect to the axis X, one end of each rod 10 being mounted on the wall 4 and the other end on an electrically conductive flange 12 mounted on the wall 2. The electrode 6 is provided with two openings 14 permitting the passage of the rods 10, without any contact with the electrodes 6.

The volume between the walls 2 and 4 is filled with deionized water 16 in which is thus immersed the electrode 6.

The generator shown in FIG. 5 also comprises a cylindrical, electrically conductive, inner wall 18 of axis X placed in the volume defined by the wall 4. Walls 2,4 and 18 have substantially the same length. One end of the wall 18 is tightly sealed by an electrically insulating element 20, which also seals the corresponding end of the assembly defined by the walls 4 and 18. The other end of this assembly is tightly sealed by an electrically insulating, annular plate 22.

The capacitor C2 is constituted by the electrode 6 and the ground wall 2. The wall 18 constitutes the inner electrode of the shaping line Zo, whose outer electrode is constituted by the wall 4.

In the interior of the volume defined by the wall 18 extend along the axis X, passing from element 20 to annular element 22, the transformer T, the inductor L3 and the saturable inductor L1. The median plane of the generator is between L1 and L3.

The transformer T and inductor L1 are e.g. of the type developed in the Lawrence National Livermore Laboratory in the U.S.A. for the production of saturable inductor, electric pulse generators and which are very diagrammatically shown in FIG. 5.

The inductor L3 is constituted by an electrically insulating, cylindrical element 24 of axis X onto which is wound an electric conductor 26 (giving the coils of axis X). A central electrical connector 28 traverses the element 24 along axis X and one terminal of the secondary of the transformer T is connected to one end of said connector 28, whilst the other terminal of the secondary of the transformer T is grounded.

One end of the conductor 26 traverses the insulating element 20 and makes it possible to apply to the inductor L3 the constant voltage referred to hereinbefore. The other end of the conductor 26 is connected to the central connector 28.

A metal tube 30 of axis X also passes through the element 20. Said tube 30 is connected to a terminal of the primary of the transformer T. The other terminal of said primary is connected to a conductor 32, which also traverses the element 20. The external diameter of the tube 30 is smaller than the external diameter of the transformer T.

Between the inductors L1 and L3 is provided an electrically conductive ring 34 of axis X, which contains the median plane of the generator and to which is connected the connector 28. To this end, the latter is provided on the side of the ring 34 with a plurality of flexible conductive strips, which penetrate the ring 34, said flexible strips bearing against the interior thereof. Another electrically conductive ring 36 of axis X surrounds the ring 34, which rests on ring 36 via an electrically insulating element 38.

The electric coils corresponding to the toroidal core transformer T of axis X are located parallel to said axis X. In the same way, the coil corresponding to the inductor L1 is parallel to the axis X on the toroidal core of axis X of inductor L1 (whereas the corresponding coil of inductor L3 is positioned in transverse manner with respect to the axis X).

A terminal of the inductor L1 is connected to the ring 34, whilst the other terminal of the inductor L1 is connected to the ring 36. Thus, the inductor L1 has several coils in parallel and each of these has a terminal connected to the ring 34, whilst the other terminal is connected to the ring 36.

In the median plane of the generator shown in FIG. 5, two aligned metal screws 40, which are symmetrical with respect to the axis X are provided for connecting the wall 18 (inner electrode of the line Zo) to the ring 36. The screws 40 and the rods 10 are aligned.

Moreover, in said median plane, two aligned metal screws 42, which are symmetrical with respect to X and perpendicular to the screws 40 are provided for connecting the electrode 6 of the capacitor C2 to the ring 34. Conductive access flanges 44 on the outer wall 2 make it possible to fix the screws 42 to the ring 34. These screws 42 pass through the wall 4 without touching the latter using openings 46 provided for said purpose on said wall 4. Therefore deionized water also fills the volume between the walls 4 and 18, so that the wall 18 is immersed in water.

The screws 42 also traverse the wall 18 and the ring 36 without touching them using holes 50 and 48 respectively provided on the ring 36 and the wall 18. In addition, each hole 48 is closed by a tight, electrically insulating element 52, in order to prevent the penetration of deionized water into the interior of the volume defined by the wall 18 and which is intended to contain oil or liquid freon 66, as will be discussed hereinafter.

Each screw 40 is firstly put into place from the opening existing on the wall 2 in the absence of the corresponding flange 12 after which the rod 10 and said flange 12 are put into place.

The generator shown in FIG. 5 also comprises a metal part 54 in the form of a cylindrical cover of axis X, whose diameter is similar to that of the wall 2. This cover is tightly fixed against the plate or annular element 22. Moreover, the cover 54, which is grounded, comprisess a tubular part 56 of axis X and which is electrically conductive and which extends into the space between the cover and the element 22 surrounding the opening of the annular element 22. Core members 58 of axis X made from a ferromagnetic material, e.g. ferrite or the amorphous material known under the name METGLASS are stacked parallel to the axis X between the cover 54 and the element 22 and surround the tubular part 56. These core members 58 have a limited reciprocal spacing in order to permit the passage of oil or liquid freon.

It should also be noted that the core of inductor L1 and the core of the transformer T are also constituted by stacks of ferromagnetic members spaced from one another in accordance with X in order to permit said oil or liquid freon circulation.

The cover 54 also has a metal plug 60 of axis X giving access to the interior of said cover.

The generator also comprises a plurality of coaxial cables 62, whose braids are in parallel and connected to the cover 54. This cover can be electrically connected to the wall 2 and by not shown metal screws, which are screwed into said wall 2 through the element 22. The braids of the coaxial cables are connected to the outer electrode of the line Zo, because the walls 2 and 4 are electrically connected.

The connections between the braids of the coaxial cables and the cover are distributed over a circumference of axis X and having a diameter smaller than that of the tubular part 56 and the cores of said coaxial cables provided with electrically insulating sheaths tightly traversed, parallel to X, the cover 54 and the tubular part for connection to the end of the central electrode 18 of Zo via an electrical connection element 64, which is mounted in the opening of the annular element 22 and in contact with the end of the central electrode 18 of Zo, receiving the cores of the coaxial cables.

The saturable inductor L2 is here constituted by the stack of core members 58, traversed by the cores of the coaxial cables and which are connected to the central electrode 18.

The coaxial cables are such that the impedance of the assembly constituted by their parallel connected cores is equal to that of the line Zo, which can e.g. be 2 Ohms. In this case, it is possible to use twenty-five 50 Ohm parallel coaxial cables.

As a result of the fact that the line Zo is charged by its "centre" (in the median plane of the generator), instead of charging it at one end, it is possible to reduce the charging time of Zo, which makes it possible to use a lower value inductor L2 and which consequently has smaller dimensions, so that it is less expensive and has a lower saturation inductance.

The annular element 22 on the one hand insulates the stack of core members 58 and also forms a sealing means for preventing any contact between the deionized water and the oil or liquid freon 66 filling the internal volume defined by the wall 18.

More specifically, for cooling the ferromagnetic cores of the transformer T and the inductors L1 and L2, there is an oil or liquid freon flow in the cover 54 through the core members 58, through the tubular part 56 formed for this purpose, through the opening of the annular element 22, through the core members of L1 (L1 being produced on an electrically insulating tubular body 67 of axis X, which is peripherally perforated and sealed facing the ring 34) in the volume defined by the wall 18, through the core members of T and through the tube 30.

The arrangement shown in FIG. 5 has neither a switch I, nor a capacitor C1, and the load R is not shown. In accordance with the diagram of FIG. 1, R is connected on one side to the cores of the coaxial cable 62 connected in parallel and on the other side to the braids of said cables and a terminal of the switch I can be connected to the conductor 32, a terminal of said capacitor C1 then being connected to the metal tube 30.

Figure 3:
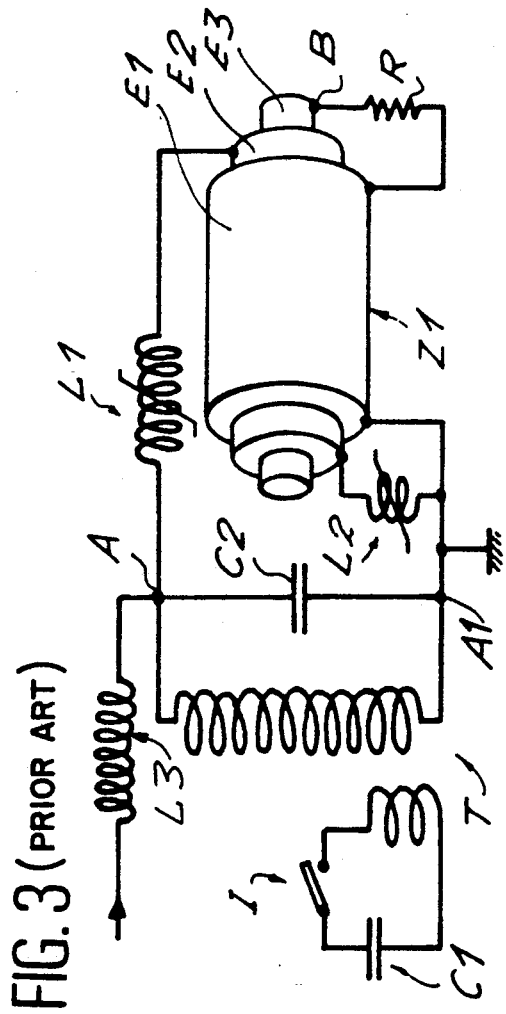
FIG. 3 a diagrammatic view of another known electric pulse generator, which has already been described.

The generator according to the invention and diagrammatically shown in FIG. 7 corresponds to the electric diagram of FIG. 3, except that in said generator the line is charged in its centre and not at one end. Therefore the generator shown in FIG. 7 differs from that of FIG. 5 in that the shaping line is double in the generator of FIG. 7, which implies an adaptation of the connections of said double line with the inductors L1 and L2, said inductor L2 being constructed differently, which involves an adaptation of the oil flow.

Figure 8:
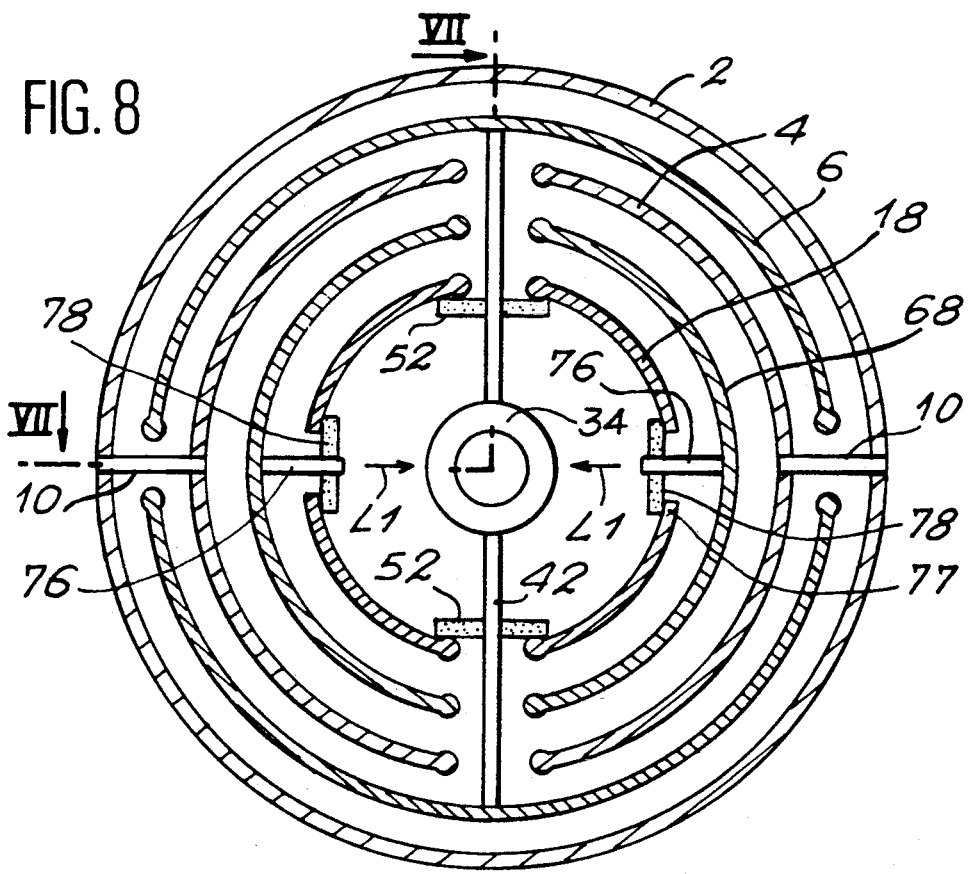
FIG. 8 a cross-sectional view of the generator shown in FIG. 7.

More specifically, the generator shown in FIG. 7 comprises a cylindrical electrode 68 of axis X between the wall 4 and the wall 18. Said electrode 68 constitutes the electrode E2 and has two openings for the passage of screws 42 without any contact with the electrode 68. This is shown in FIG. 8, which is a cross-sectional view of FIG. 7 in the median plane of the generator shown in the latter. The cover 54 is eliminated and replaced by a metal plate 70 in electric contact and tight with the corresponding ends of the walls 2 and 4, a space existing between said plate 70 and the corresponding end of the electrode 68.

The insulating element 20 is replaced by an annular metal plate 72 of axis X with which are in electric, tight contact the corresponding ends of the walls 2 and 4 and the electrode 68. An electrically insulating element 74 in the form of a disk of axis X tightly closes the opening of the annular plate 72 and the end of the electrode 18, which is located on the side of the disk 74, which is traversed by the metal tube 30 of axis X. On the side of the plate 70, the electrode 18 is tightly sealed by a metal plate 71.

The stack of core members 58 is no longer placed on the side of the inductor L1 and is instead located on the side of the transformer T. Said stack is located in the space between the wall 4 and the electrode 68 with which it is in contact. Moreover, it is in contact on one side with the plate 72 and on the other side with an annular, electrically insulated element 58, which is also located between the wall 4 and the electrode 68 and closes the space between the same.

The ring 36 is eliminated and the inductor L1 is connected on one side to the ring 34, as hereinbefore, and on the other side to the electrode 68. The inductor L1 comprises two parallel-connected coils. Each coil has a terminal connected to the ring 34, whilst its other terminal is connected to the electrode 68 in the median plane of the generator of FIG. 7, through the wall 18 provided for this purpose with two coaxial openings 77 (one per coil), whose axis is that of the rods 10 (cf. FIG. 8). The connections of said terminals of the coils of the inductor L1 with the electrode 68 are formed via conductive rods 76 in FIGS. 7 and 8 and the corresponding opening 77 on the wall 18 are tightly sealed by electrically insulating elements 78.

If the inductor L1 had more than two coils, obviously the same number of tightly sealed openings would be provided as coils on wall 18. As can be seen in FIG. 8, the rods 76 and 10 are on the same axis.

For the generator of FIG. 7, the flow of oil or liquid freon uses an electrically insulating tube 80, which tightly traverses the plates 70,71 and issues into the tubular body 67 of the inductor L1. The oil or liquid freon traverses the tube 80, the core members of L1, flows in the volume defined by the electrode 18, traverses the core members of T and passes out through the metal tube 30. A flow of oil or liquid freon is also provided in the wall 4 and in the electrode 68 for cooling the core members 58 of inductor L2. It is pointed out that said inductor L2 results, in the case of FIG. 7, from the passage along axis X of the stack of core members 58 by the electrode 68. These core members 58 make it possible to avoid a short-circuit between the electrodes E1 and E2 throughout the line charging phase, but causes a short-circuit at the time of the saturation of L2.

The coaxial cable 62, whose cores are connected to the corresponding end of the electrode 18 via the metal plate 71 are in a sufficient number to be matched to the impedance of the double coaxial line. The braids of the coaxial cables are connected to the plate 70, which is grounded and the cores provided with electrically insulating sheaths tightly traverse said plate 70.

In the case of FIG. 7, the not shown load R is connected on one side to the cores of the coaxial cables and on the other to the braids of said coaxial cables.

We claim:

1. Electric pulse generator comprising a shaping line having at least two facing coaxial electrodes for shaping pulses, magnetic compression means incorporating a capacitor and provided for charging said shaping line and a magnetic switch with a first saturable inductor for discharging said line, said capacitor having at least two facing, coaxial electrodes said capacitor electrodes and said shaping line electrodes having a common axis, said electrodes of said capacitor surrounding said shaping line, said generator also comprising a transformer for charging said coaxial electrode capacitor, at least one demagnetization inductor and a second saturable inductor associated with said coaxial electrode capacitor in the magnetic compression means and which connects said capacitor to said shaping line, said transformer, said demagnetization inductor and said second saturable inductor being surrounded by said shaping line.

2. Generator according to claim 1, wherein said shaping line is a double line.

3. Generator according to claim 1, wherein the connection between said coaxial electrode capacitor and said second inductor and the connection between said second inductor and said shaping line are each secured by at least two electrical conductors extending perpendicular to said common axis of said capacitor and shaping line electrodes, in the median plane of said shaping line, said plane being perpendicular to said common axis.

4. Generator according to claim 1, wherein one of the electrodes of said capacitor and one of the electrodes of said shaping line are grounded and in that said two grounded electrodes are connected by at least two electrical conductors extending perpendicular to said common axis of said grounded electrodes, in the median plane of the shaping line, said plane being perpendicular to the said common axis.

5. Generator according to claim 1, wherein said shaping line is charged in its center in accordance with said common axis of said coaxial shaping line and capacitor electrodes.

6. Generator according to claim 1, wherein an internal volume of said shaping line is immersed in a liquid constituted by oil and the dielectric of said capacitor is an electrically insulating liquid, electrically insulating liquid tight means being provided for preventing any contact between said shaping line liquids and said electrically insulating liquids.

7. Generator according to claim 1, wherein an internal volume of said shaping line is immersed in a liquid constituted by liquid freon and the dielectric of said capacitor is an electrically insulating liquid, electrically insulating liquid tight means being provided for preventing any contact between said shaping line liquids and said electrically insulating liquids.

8. Electric pulse generator comprising a shaping line having at least two facing coaxial electrodes for shaping pulses, magnetic compression means incorporating a capacitor and provided for charging said shaping line and a magnetic switch with a first saturable inductor for discharging said line, said capacitor having at least two facing, coaxial electrodes said capacitor electrodes and said shaping line electrodes having a common axis, said electrodes of said capacitor surrounding said shaping line, wherein one of said electrodes of said capacitor and one of said electrodes of said shaping line are grounded, said two grounded electrodes being connected by at least two electrical conductors extending perpendicular to said common axis of said grounded electrodes, in the median plane of said shaping line, said plane being perpendicular to said common axis.

9. Generator according to claim 8, wherein said shaping line is a double line.

10. Generator according to claim 8, wherein said generator also comprises a transformer for charging said coaxial electrode capacitor, at least one demagnetization inductor and a second saturable inductor associated with said coaxial electrode capacitor in the magnetic compression means and which connects said capacitor to said shaping line, said transformer, said demagnetization inductor and said second saturable inductor being surrounded by said shaping line.

11. Generator according to claim 8, wherein the connection between said coaxial electrode capacitor and said second inductor and the connection between said second inductor and said shaping line are each secured by at least two electrical conductors extending perpendicular to said common axis of said capacitor and shaping line electrodes, in the median plane of said shaping line, said plane being perpendicular to said common axis.

12. Generator according to claim 8, wherein said shaping line is charged in its center in accordance with said common axis of said coaxial shaping line and capacitor electrodes.

13. Generator according to claim 8, wherein an internal volume of said shaping line is immersed in a liquid constituted by oil and the dielectric of said capacitor is an electrically insulating liquid, electrically insulating liquid tight means being provided for preventing any contact between said shaping line liquids and said electrically insulating liquids.

14. Generator according to claim 8, wherein an internal volume of said shaping line is immersed in a liquid constituted by liquid freon and the dielectric of said capacitor is an electrically insulating liquid, electrically insulating liquid tight means being provided for preventing any contact between said shaping line liquids and said electrically insulating liquids.

* * * * *